United States Patent [19]
Miller et al.

[11] Patent Number: 4,536,663
[45] Date of Patent: Aug. 20, 1985

[54] COMPARATOR CIRCUIT HAVING FULL SUPPLY COMMON MODE INPUT

[75] Inventors: Ira Miller, Tempe; Robert C. Rumbaugh, Phoenix; John J. Price, Jr., Mesa, all of Ariz.

[73] Assignee: Motorola, Inc., Schaumburg, Ill.

[21] Appl. No.: 510,006

[22] Filed: Jul. 1, 1983

[51] Int. Cl.³ .............................................. H03K 3/02
[52] U.S. Cl. ..................... 307/355; 307/496; 307/491; 307/270; 328/147; 330/257; 330/263
[58] Field of Search ............... 307/491, 499, 494–496, 307/500, 243, 255, 270, 350, 355; 330/257, 263, 267, 288, 124 R; 328/146–147

[56] References Cited
U.S. PATENT DOCUMENTS

| | | | |
|---|---|---|---|
| 3,921,008 | 11/1975 | Claverie | 307/496 X |
| 4,147,944 | 4/1979 | Monticelli | 307/355 X |
| 4,345,213 | 8/1982 | Schade, Jr. | 330/288 X |
| 4,378,529 | 3/1983 | Dobkin | 330/257 |
| 4,446,385 | 5/1984 | Orengo et al. | 307/355 |

FOREIGN PATENT DOCUMENTS 0088919  5/1983  Japan ..................... 307/497

Primary Examiner—Stanley D. Miller
Assistant Examiner—D. R. Hudspeth
Attorney, Agent, or Firm—Vincent B. Ingrassia

[57] ABSTRACT

The input voltage signals to a comparison circuit may vary between levels substantial equal to the first and second supply voltages (e.g. typically 5 volts and ground). A first transistor circuit is coupled to a current mirror circuit and to an output node for supplying a mirrorable current to the current mirror circuit which in turn reduces the voltage at the output node when the first input voltage approaches the upper supply voltage, and supplies a current to the output to increase the voltage thereat when the second input approaches the upper supply voltage. A second transistor circuit is also coupled to the current mirror and to the output for supplying a mirrorable current to the current mirror means so as to reduce the voltage at the output when the second input voltage approaches ground, and supplies current to the output to increase the voltage thereat when the first input voltage approaches ground. The output node has coupled thereto a level shifting transistor and first and second follower transistors.

8 Claims, 1 Drawing Figure

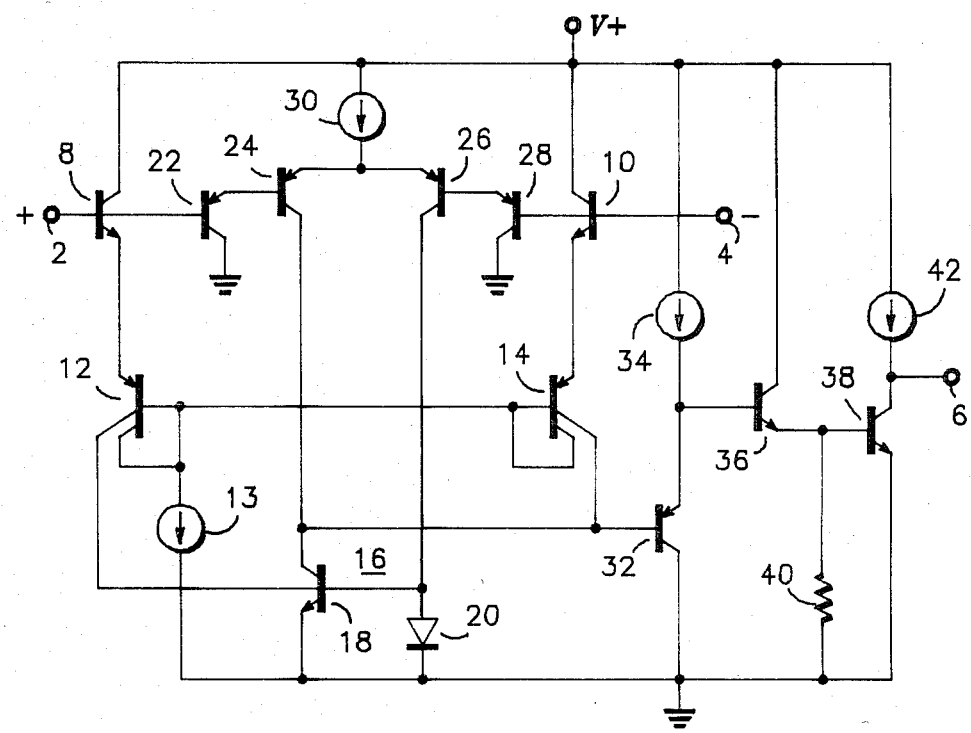

4,536,663

COMPARATOR CIRCUIT HAVING FULL SUPPLY COMMON MODE INPUT

BACKGROUND OF THE INVENTION

This invention relates generally to comparator circuits and, more particularly, to a comparator circuit in which the input signal voltage may vary from a first voltage substantially equal to a first supply voltage to a second voltage substantially equal to a second lower supply voltage.

Comparator circuits are known in which the input voltage levels are permitted to swing to one or the other supply voltages, but not both. For example, the LM124 manufactured by National Semiconductor permits the input voltage to go to ground. If, however, the input voltage were to reach a level equivalent to the positive supply voltage (e.g. 5 volts), the PNP current source which supplies a differential pair is turned off. In contrast to this, the μA741 manufactured by Fairchild permits the input voltage to become as high as the positive supply voltage. If, however, the input voltage were to drop to ground, the current mirror incorporated into the circuit would turn off.

SUMMARY OF THE INVENTION

It is an object of the present invention to provide an improved comparator circuit.

It is a further object of the present invention to provide a comparator circuit wherein the input signal voltage levels may vary from the high supply voltage (e.g. 5 volts) to a lower supply voltage (e.g. ground or less).

According to a broad aspect of the invention there is provided a circuit for comparing first and second input voltages which may vary between a first supply voltage and a second lower supply voltage, said circuit being adapted to be powered by said first and second supply voltages and comprising current mirror means coupled to an output of said circuit; first transistor means coupled to said current mirror means and to said output for supplying a mirrorable current to said current mirror means to reduce the voltage at said output when said first input voltage is slightly less than said second input voltage, and said second input voltage is slightly less than or substantially equal to said first supply voltage, and for supplying current to said output to increase the voltage at said output when said second input voltage is slightly less than said first input voltage, and said first input voltage is slightly less than or substantially equal to said first supply voltage; and second transistor means coupled to said current mirror means and to said output for supplying a mirrorable current to said current mirror means to reduce the voltage at said output when said first input voltage is slightly less than said second input voltage, and said first input voltage is slightly greater than or substantially equal to said second supply voltage, and for supplying current to said output to increase the voltage at said output when said second input voltage is slightly less than said first input voltage and said second input voltage is slightly greater than or substantially equal to said second supply voltage.

BRIEF DESCRIPTION OF THE DRAWINGS

The above and other objects, features and advantages of the present invention will be more clearly understood from the following detailed description taken in conjunction with the accompanying drawing which is a schematic diagram of the inventive comparator circuit.

DESCRIPTION OF THE PREFERRED EMBODIMENT

The circuit shown in the drawing includes a non-inverting input terminal 2, an inverting input terminal 4, and an output terminal 6. The circuit is powered by a first source of supply voltage V+ (e.g. 5 volts) and a second source of supply voltage (in this case ground).

That portion of the circuit which permits the inputs to attain a level substantially equal to the more positive supply voltage includes NPN input transistors 8 and 10 and PNP transistors 12 and 14 operating in conjunction with a current mirror circuit 16 which includes NPN transistor 18 and diode means 20. Input transistors 8 and 10 have base electrodes coupled to input terminals 2 and 4 respectively and each have a collector coupled to a first source of supply voltage (V+). The emitters of transistors 8 and 10 are coupled to the emitters of transistors 12 and 14 respectively. The base electrodes of transistors 12 and 14 are coupled together and to a first collector of each of transistors 12 and 14. The second collector of transistor 12 is coupled to the base of transistor 18 and the anode of diode means 20. A current source 13 is coupled between the base of transistor 12 and ground. Both the emitter of transistor 18 and the cathode of diode means 20 are coupled to a second source of supply voltage (ground). The second collector of transistor 14 is coupled to the collector of transistor 18 in current mirror 16.

That portion of the circuit which permits the inputs to fall completely to the lower supply voltage includes PNP transistors 22, 24, 26, 28 and current source 30 all of which operate in conjunction with current mirror circuit 16. The emitters of transistors 24 and 26 are coupled via current source 30 to V+. The bases of transistors 22 and 28 are coupled respectively to input terminals 2 and 4, and their collectors are coupled to ground. The emitters of transistors 22 and 28 are coupled to the base electrodes of transistors 24 and 26 respectively. The collector of transistor 26 is coupled to the anode of diode means 20, and the collector of transistor 24 is coupled to the collector of transistor 18 in current mirror 16 and to the base of level shift PNP transistor 32 as is the second collector of transistor 14.

The collector of transistor 32 is coupled to ground, and the emitter of transistor 32 is coupled to V+ via current source 34 and to the base of a first NPN follower transistor 36. The collector of transistor 36 is coupled to V+, and the emitter of transistor 36 is coupled to the base of a second NPN transistor 38 and, via resistor 40, to ground. The emitter of transistor 38 is coupled to ground, and its collector is coupled to output terminal 6 and, via current source 42, to V+.

Assume that input terminal 2 is near ground and the voltage appearing at input terminal 4 is high enough with respect to that at terminal 2 to turn transistors 22 and 24 on harder than transistors 26 and 28. With input terminals 2 and 4 near ground, transistors 8 and 10 are nonconductive and thus, mirrorable current is not supplied to the current mirror circuit. Since transistor 24 has been rendered more conductive, extra current is supplied to the collector of transistor 18 causing its collector voltage to rise. The resulting increase in voltage at the base of transistor 32 will cause its emitter voltage to rise and drive transistor 38 into conduction.

This in turn, causes the voltage at output terminal 6 to fall.

Assume now that the voltages appearing at terminals 2 and 4 are approaching the positive supply voltage V+. This causes transistors 22, 24, 26 and 28 to be rendered nonconductive. Assume also, that the voltage appearing at input terminal 4 is sufficiently high enough with respect to the voltage appearing at terminal 2 so as to cause transistors 10 and 14 to be more conductive than transistors 8 and 12. Transistor 12 will supply less mirrorable current to the anode of diode means 20. The voltage at the collector of transistor 18 will then rise. When the base voltage of transistor 32 rises, its emitter voltage will also rise. This in turn causes transistor 38 to be rendered conductive. Thus, the output voltage at terminal 6 will go low.

Next, assume that the common mode voltage remains near the positive supply and that the voltage level at input terminal 2 rises above that at input terminal 4. This renders transistors 8 and 12 more conductive than transistors 10 and 14. Thus, a more mirrorable current is supplied to the anode of diode means 20 which causes transistor 18 to conduct and divert current from the base of transistor 32 causing the voltage at the base of transistor 32 to drop. This reduction in voltage causes the voltage at the emitter of transistor 32 to decrease and render transistor 38 nonconductive. Thus, a high voltage will appear at output terminal 6. If now, the common mode voltage at terminals 2 and 4 were near ground, and the voltage at input terminal 2 is greater than that at input terminal 4, transistors 26 and 28 would be more conductive than transistors 22 and 24. This causes the collector voltage of transistor 18 to fall which results in a lower voltage at the emitter of transistor 32 and at the base of transistors 36 and 38 rendering transistor 38 nonconductive. Thus, the voltage at output terminal 6 will rise.

In order to more accurately control the points at which transistors 22 and 24, or transistors 26 and 28 turn off, a clamp may be coupled between ground and the emitters of transistors 24 and 26. This clamp may comprise a PNP transistor having an emitter coupled to the emitters of transistors 24 and 26, a collector coupled to ground and a base coupled to a reference voltage which is substantially equal to $(V+)-(2V_{BE})$ where $V_{BE}$ is the base-emitter voltage of a transistor. Similarly, a clamp may be coupled between the common base of transistors 12 and 14 and V+. This clamp may be an NPN transistor having an emitter coupled to the common base of transistors 12 and 14, a collector coupled to V+ and a base coupled to $2V_{BE}$.

The above description is given by way of example only. Changes in form and details may be made by one skilled in the art without departing from the scope of the invention as defined by the appended claims.

We claim:

1. A circuit for comparing first and second input voltages which may vary between a first supply voltage and a second lower supply voltage, said circuit characterized by being powered by said first and second supply voltages and comprising:

current mirror means coupled to an output of said circuit;

first transistor means coupled to said current mirror means and to said output for supplying a mirrorable current to said current mirror means to reduce the voltage at said output when said first input voltage is slightly less than said second input voltage, and said second input voltage is slightly less than or substantially equal to said first supply voltage, and for supplying current to said output to increase the voltage at said output when said second input voltage is slightly less than said first input voltage, and said first input voltage is slightly less than or substantially equal to said first supply voltage; and second transistor means coupled to said current mirror means and to said output for supplying a mirrorable current to said current mirror means to reduce the voltage at said output when said first input voltage is slightly less than said second input voltage, and said first input voltage is slightly greater than or substantially equal to said second supply voltage, and for supplying current to said output to increase the voltage at said output when said second input voltage is slightly less than said first input voltage and said second input voltage is slightly greater than or substantially equal to said second supply voltage.

2. A circuit according to claim 1 wherein said first transistor means comprises:

a first NPN transistor having a base for coupling to said first input voltage, a collector for coupling to said first supply voltage and having an emitter;

a second NPN transistor having a base for coupling to said second input voltage, a collector for coupling to said first supply voltage and having an emitter;

a first PNP transistor having an emitter coupled to the emitter of said first NPN transistor, a collector coupled to said current mirror means, and having a base; and a second PNP transistor having an emitter coupled to the emitter of said second NPN transistor, a base coupled to the base of said first PNP transistor and a collector coupled to said output.

3. A circuit according to claim 2 wherein said second transistor means comprises:

a third PNP transistor having a collector coupled to said second supply voltage, a base coupled to said first input voltage and having an emitter;

a fourth PNP transistor having a base coupled to the emitter of said third PNP transistor, a collector coupled to said output and having an emitter;

a fifth PNP transistor having an emitter coupled to the emitter of said fourth PNP transistor, a collector coupled to said current mirror means and having a base;

a sixth PNP transistor having an emitter coupled to the base of said fifth PNP transistor, a collector coupled to said second supply voltage and a base coupled to said second input voltage; and a current source for coupling between said first supply voltage and the emitters of said fourth and fifth PNP transistors.

4. A circuit according to claim 3 wherein each of said first and second PNP transistors are equipped with a second collector coupled to its respective base.

5. A circuit according to claim 4 further comprising a level shifting transistor having a base coupled to said output, a collector for coupling to said second supply voltage and an emitter for coupling to said first supply voltage.

6. A circuit according to claim 5 further comprising a first follower transistor having a base coupled to the emitter of said level shifting transistor, a collector for coupling to said first supply voltage and an emitter for coupling to said second supply voltage.

7. A circuit according to claim 6 further comprising a second transistor having a base coupled to the emitter of said first follower transistor, a collector for coupling to said first supply voltage, and an emitter for coupling to said second supply voltage.

8. A circuit according to claim 7 wherein said first supply voltage is approximately 5 volts and said second supply voltage is ground.

* * * * *